(12) United States Patent
Mikoshiba et al.

(10) Patent No.: US 8,808,973 B2
(45) Date of Patent: Aug. 19, 2014

(54) METHOD OF FORMING PATTERN

(75) Inventors: Satoshi Mikoshiba, Yamato (JP); Koji Asakawa, Kawasaki (JP); Hiroko Nakamura, Yokohama (JP); Shigeki Hattori, Yokohama (JP); Atsushi Hieno, Kawasaki (JP); Tsukasa Azuma, Kawasaki (JP); Yuriko Seino, Yokohama (JP); Masahiro Kanno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/402,400

(22) Filed: Feb. 22, 2012

(65) Prior Publication Data

US 2012/0214094 A1 Aug. 23, 2012

(30) Foreign Application Priority Data

Feb. 23, 2011 (JP) ................................. 2011-037273

(51) Int. Cl.
*G03F 7/26* (2006.01)
(52) U.S. Cl.
USPC .......................................................... 430/322
(58) Field of Classification Search
CPC ............. H01L 21/3086; H01L 21/302; B81C 2201/0149; G03F 7/0002; G03F 7/20; G03F 7/26
USPC ................... 430/322, 323, 325, 330
See application file for complete search history.

(56) References Cited

U.S. PATENT DOCUMENTS

| 6,746,825 | B2* | 6/2004 | Nealey et al. ................. 430/315 |
| 2003/0091752 | A1 | 5/2003 | Nealey et al. |
| 2008/0311347 | A1* | 12/2008 | Millward et al. ............. 428/144 |
| 2009/0242925 | A1* | 10/2009 | Kitagawa et al. ............... 257/99 |
| 2011/0059299 | A1* | 3/2011 | Kim et al. ................. 428/195.1 |

FOREIGN PATENT DOCUMENTS

| CN | 101077768 A | 11/2007 |
| JP | 2008-96596 | 4/2008 |
| JP | 2009-298911 | 12/2009 |
| KR | 10-2009-0063612 | 6/2009 |
| TW | 200702910 | 1/2007 |
| TW | 200949452 A1 | 12/2009 |

OTHER PUBLICATIONS

Sang Ouk Kim, et al., "Epitaxial self-assembly of block copolymers on lithographically defined nanopatterned substrates", letters to nature, vol. 424, Jul. 24, 2003, pp. 411-414.

(Continued)

*Primary Examiner* — Brittany Raymond
(74) *Attorney, Agent, or Firm* — Oblon, Spivak, McClelland, Maier & Neustadt, L.L.P.

(57) ABSTRACT

According to one embodiment, there is provided a method of forming a pattern including forming a polymer layer on a substrate, the polymer layer including a first and second regions, selectively irradiating either of the first and second regions with energy rays or irradiating the first and second regions with energy rays under different conditions to cause a difference in surface free energy between the first and second regions, thereafter, forming a block copolymer layer on the polymer layer, and causing microphase separation in the block copolymer layer to simultaneously form first and second microphase-separated structures on the first and second regions, respectively.

6 Claims, 2 Drawing Sheets

(56) References Cited

OTHER PUBLICATIONS

Ricardo Ruiz, et al., "Density Multiplication and Improved Lithography by Directed Block Copolymer Assembly", Science, vol. 321, Aug. 15, 2008, 1 cover page and pp. 936-939.

Korean Office Action issued Mar. 22, 2013, in Korea Patent Application No. 10-2012-15224 (with English translation).

Office Action mailed Feb. 17, 2014, in Taiwanese Patent Application No. 101105510 (with English-language translation).

* cited by examiner

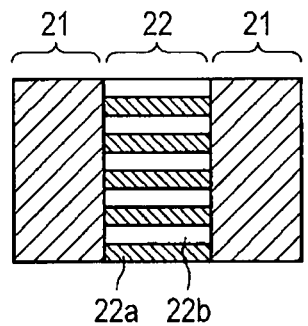
F I G. 2A
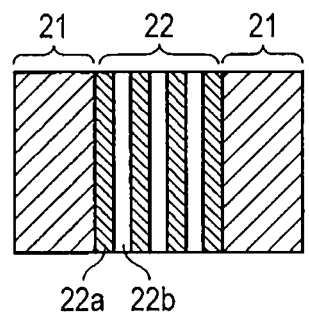
F I G. 2B
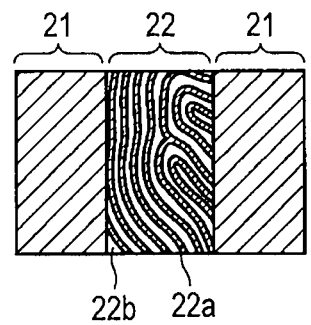
F I G. 2C

— 1 —

METHOD OF FORMING PATTERN

CROSS-REFERENCE TO RELATED APPLICATIONS

This application is based upon and claims the benefit of priority from prior Japanese Patent Application No. 2011-037273, filed Feb. 23, 2011, the entire contents of which are incorporated herein by reference.

FIELD

Embodiments described herein relate generally to a method of forming a pattern that can be applied to microprocessing of a semiconductor device and the like.

BACKGROUND

Microprocessing technology by lithography has been adopted for processes of manufacturing semiconductor devices including Large Scale Integrations (LSIs). Still finer microprocessing will be required in the future and attempts are being made to make the wavelength of light used in lithography shorter and to achieve higher performance of resist. However, it is becoming increasingly more difficult to improve the resolution by the above measures.

Therefore, microprocessing technology using microphase separation of a block copolymers is becoming a focus of attention. In the microprocessing technology, regular arrangement of microphase-separated structure of block copolymer is required and for this purpose, various contrivances are attempted.

However, the semiconductor device includes not only a region where a fine pattern is formed, but also a wide-area region where no pattern is formed. Thus, when a processing method using microphase separation of block copolymers is used, it is necessary to mask a region where no pattern should be formed by a resist or the like before a fine pattern is formed.

In order to form a pattern with less number of processes, various contrivances such as modification of block copolymers have been made. However, many processes are needed for synthesis of such block copolymers, which causes a problem of increasing costs instead.

BRIEF DESCRIPTION OF THE DRAWINGS

FIGS. 2A, 2B and 2C are plan views showing microphase-separated structures of block copolymers according to Examples.

DETAILED DESCRIPTION

In general, according to one embodiment, there is provided a method of forming a pattern including forming a polymer layer on a substrate, the polymer layer including first and second regions; selectively irradiating either of the first and second regions with energy rays or irradiating the first and second regions with energy rays under different conditions to cause a difference in surface free energy between the first and second regions; thereafter, forming a block copolymer layer on the polymer layer; and causing microphase separation in the block copolymer layer to simultaneously form first and second microphase-separated structures on the first and second regions, respectively. The block copolymer layer includes a block copolymer containing first and second block chains different from each other. By causing microphase separation in the block copolymer layer, the first and second block chains are oriented perpendicularly to the substrate in the first microphase-separated structure and oriented parallel to the substrate in the second microphase-separated structure.

Embodiments will be described below with reference to drawings.

FIGS. 1A to 1D are sectional views illustrating a method of forming a pattern according to an embodiment. An overview of the method of forming a pattern according to the embodiment will be provided with reference to FIGS. 1A to 1D.

Figure 1A:
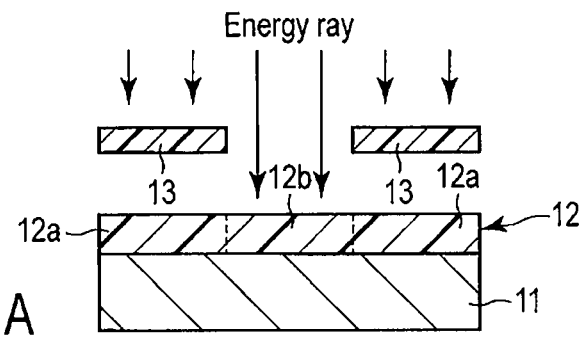
FIGS. 1A, 1B, 1C and 1D are sectional views illustrating a method of forming a pattern according to an embodiment.

As shown in FIG. 1A, a polymer layer 12 is formed on a substrate 11. The polymer layer 12 includes first and second regions. The first and second regions can have different surface energies by irradiating either of the first and second regions with energy rays or irradiating the first and second regions with energy rays under different conditions.

Figure 1B:
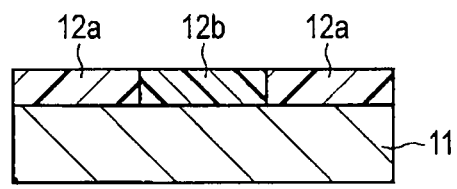
Figure 1C:
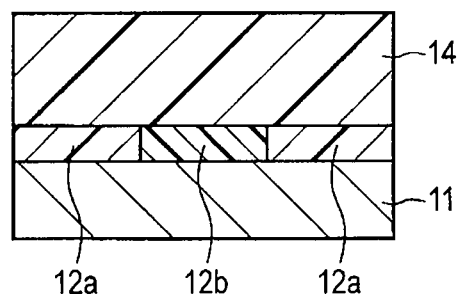

In the case of irradiating either of the first and second regions, the region that should not be irradiated with energy rays is shielded with a mask 13, as shown in FIG. 1A. As a result, as shown in FIG. 1B, a first region 12a and a second region 12b having different surface free energy are formed on the polymer layer 12.

Figure 1D:
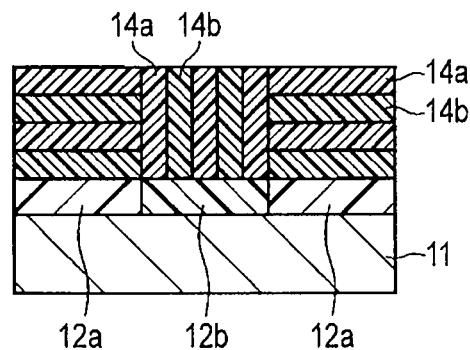

Subsequently, a block copolymer layer 14 is formed on the polymer layer 12 (FIG. 10). The block copolymer layer 14 includes a block copolymer containing a first block chain and a second block chain different from each other. A block chain is a polymer chain including two or more repeating units and all of the repeating units included in one of the block chain are identical to each other. After the block copolymer layer 14 being formed, microphase separation is caused in the block copolymer layer 14 by heating the layer for annealing. As a result, as shown in FIG. 1D, first and second microphase-separated structures are simultaneously formed on the first region 12a and the second region 12b, respectively. In the first and second microphase-separated structures, the first and second block chains are oriented perpendicularly to and parallel to the substrate 11, respectively.

FIG. 1D shows that block copolymers on the first region 12a have first block chains and second block chains oriented parallel to the substrate 11. As a result, a lamellar phase in which a first block chain layer 14a and a second block chain layer 14b are alternately stacked in a direction perpendicularly to the substrate 11 is formed. On the other hand, block copolymers on the second region 12b have first block chains and second block chains oriented perpendicular to the substrate 11. As a result, a lamella phase in which the first block chain layer 14a and the second block chain layer 14b are alternately stacked in a direction parallel to the substrate 11 is formed.

Either of the first and second block chains may be selectively removed from at least the second phase-separated structure to form a mask pattern. Thereafter, the surface of the substrate 11 may be etched by using the mask pattern as an etching mask.

Each process and each member of the method of forming a pattern described above will be described in more detail.

Any substrate used in a semiconductor device can be used as the substrate 11. Examples of such a substrate include a silicon wafer, a doped silicon wafer, a silicon wafer having an insulating layer and a metal layer to be an electrode or a wire on the surface thereof, a mask blank, and a III-V compound semiconductor wafer such as GaAs and AlGaAs. Other examples of the substrate include a chrome or chrome oxide evaporated substrate, an aluminum evaporated substrate, a passivation oxide film substrate such as a phosphosilicate glass (PSG) coated substrate, a spin-on glass (SOG) coated substrate, and an SiN coated substrate.

To remove organic impurities adhered to the surface of the substrate 11, it is preferable to perform pre-processing such as irradiation of the substrate 11 with ultraviolet rays.

Any material on which surface free energy changes due to irradiation with energy rays may be used as the material for the polymer layer 12, but a material whose volume is not shrunk when surface free energy changes is desirable. A molecule having Si—Si bonding changes surface free energy by a crosslinking reaction or oxidation reaction after the bonding being cleft by irradiation with energy rays. Thus, a material for the polymer layer 12 is preferably a silicon-based material having Si—Si bonding. When viewed in the light of film formation properties, oligomer including Si—Si bonding and/or polysilane is particularly preferable. When polysilane is used, it does not matter whether a main chain of polysilane is a crosslinked or not. The polysilane to be used can appropriately be selected based on coating properties and solvent resistance properties when the block copolymer layer 14 is formed after the polymer layer 12 being formed. Though the substituent of polysilane is not specifically limited, but the hydrogen atom, methyl group, phenyl group, and phenol group are preferable when viewed in the light of solubility.

Spin-coating, dip-coating, or vapor-phase growth can be used as a method of forming the polymer layer 12.

When the spin-coating is used, the material for the polymer layer 12 is diluted with a solvent and the substrate 11 is spin-coated with the diluted solution and baked on a hot plate or the like if necessary to form the polymer layer 12.

When the dip-coating is used, the material for the polymer layer 12 is diluted with a solvent and a substrate 11 is soaked in the diluted solution to form the polymer layer 12.

When the vapor-phase growth is used, the material for the polymer layer 12 is changed into a gas state by lowering the pressure, raising the temperature, or doing both and a substrate 11 is introduced thereinto and exposed to the gas for a fixed time to form the polymer layer 12 on the surface of the substrate 11.

In the spin-coating, the concentration of the material for the polymer layer 12 in the diluted solution is preferably 0.5 to 30 wt %, but is not specifically limited. It is preferable to adjust the concentration of the material in accordance with the degree of coating spread with respect to the substrate 11. The solvent to be used is preferably one that does not react with the material for the polymer layer 12, though dependent on the material for the polymer layer 12. Such solvents include aromatic hydrocarbons such as toluene, xylene, and mesitylene, cycloalkanes such as cyclohexane, cycloheptane, cyclooctane, and cyclononane, alkanes such as hexane, heptane, octane, nonane, and decane, and alkyl alcohols such as methanol, ethanol, 1-propanol, and 2-propanol. In addition to the above solvents, from the viewpoint of reactivity, wettability against the substrate 11, and volatility, organic solvents such as ketones, cellosolves, and esters used as solvents for common photoresists can also be used. Ketones include cyclohexanone, acetone, ethyl methyl ketone, and methyl isobutyl ketone. Cellosolves include methyl cellosolve, methyl cellosolve acetate, ethyl cellosolve acetate, and butyl cellosolve acetate. Esters include ethyl acetate, butyl acetate, isoamyl acetate, γ-butyrolactone, and 3-methoxy propionic ether. Combination of two or more solvents can be used if necessary. It is preferable to use a dehydrating solvent from the viewpoint of reactivity with a functional group on the surface of the substrate 11. The temperature when the substrate 11 is baked on a hot plate or the like is preferably 100 to 200° C. from the viewpoint of removing fluidity by vaporizing the used solvent.

In the dip-coating, the concentration of the material for the polymer layer 12 in the diluted solution is preferably 1 to 30 wt %. The solvent to be used is, like the solvent used for spin-coating, preferably one that does not react with the material for the polymer layer 12. Such solvents include aromatic hydrocarbons such as toluene, xylene, and mesitylene, cycloalkanes such as cyclohexane, cycloheptane, cyclooctane, and cyclononane, alkanes such as hexane, heptane, octane, nonane, and decane, and alkyl alcohols such as methanol, ethanol, 1-propanol, and 2-propanol. It is preferable to use a dehydrating solvent from the viewpoint of reactivity with a functional group on the surface of the substrate 11. After the substrate 11 being soaked in the diluted solution, it is preferable to blow away the solvent by blowing an inert gas such as nitrogen or argon against the substrate 11 and if circumstances require, to remove the solvent by heating the substrate 11 on a hot plate or the like.

In the vapor-phase growth, the pressure is lowered, the temperature is raised, or both are done to change the material for the polymer layer 12 into a gas state in accordance with vapor pressure characteristics of the material. Though dependent on the boiling point of the material for the polymer layer 12 to be used, it is preferable to raise the temperature until the material changes into a gas state by decompression from the viewpoint of stability of the material. It is preferable to insert the substrate 11 into a space in which the material for the polymer layer 12 in a gas state is present or to insert the substrate 11 in advance to expose the surface of the substrate 11 for one to five hours. After the substrate 11 being exposed, the excessive material adsorbed beyond the range of the polymer layer 12 may be washed with a solvent if necessary. Solvents described in connection with the spin-coating are preferably used here.

Energy rays with which the polymer layer 12 is irradiated are not specifically limited as long as energy rays have a wavelength at which the material for the polymer layer 12 is sensitive. More specifically, such energy rays include ultraviolet rays, an i line, h line, or g line of a mercury lamp, xenon lamp light, deep ultraviolet rays (for example, excimer laser light of KrF, ArF or the like), X-rays, synchrotron orbital radiation (SR), an electron beam, gamma rays, and an ion beam.

Free energy on the surface of the polymer layer 12 can be adjusted by irradiation of the polymer layer 12 with energy rays. Irradiation with energy rays is adjusted so that block copolymers contained in the block copolymer layer 14 formed on the polymer layer 12 are oriented to form the intended microphase-separated structure. For example, free energy on the surface of the polymer layer 12 can be adjusted by covering a region where surface free energy should be maintained low with a mask to partially block energy rays, or changing the irradiation time of energy rays or changing the kind of energy rays from region to region.

If a region where surface free energy should be maintained low is covered with a mask and only a region where surface free energy should be increased with is irradiated with energy rays, surface free energy of the region irradiated with energy rays selectively increases. As a result, a pattern due to a difference in surface free energy between the irradiated region and the non-irradiated region is formed on the polymer layer 12. The surface of the polymer layer 12 becomes more hydrophobic by decreasing surface free energy and the surface of the polymer layer 12 becomes more hydrophilic by increasing surface free energy.

Block copolymers contained in the block copolymer layer 14 formed on the polymer layer 12 can be removed either first or second block chains by some method such as a first block chain and a second block chain having different reactive ion etching (RIE) resistance.

If, for example, block copolymers of polystyrene and polybutadiene are used, only polystyrene blocks can be left by ozonation. If block copolymers of polystyrene and polymethyl methacrylate are used, only polystyrene blocks can be left by reactive ion etching using a reactive gas such as $O_2$ or $CF_4$ (K. Asakawa et al., APS March Meeting, 2000).

The method of applying block copolymers on the polymer layer 12 is not specifically limited. For example, the spin-coating, dip-coating, doctor blade method, curtain-coating, and other methods are used. After the polymer layer 12 being coated with a block copolymer solution, the solvent may be removed by heating the substrate 11 on a hot plate. The heating temperature here is preferably 70 to 120° C.

For microphase separation of block copolymers, block copolymers are generally annealed at a temperature equal to the glass transition temperature or higher. The speed of phase separation of block copolymers is known to have a correlation with the temperature of annealing (A. M. Welander et al., Macromolecules, 41, 2759-2761, 2008). If the temperature of annealing rises beyond the order-disorder transition temperature (ODT), a disordered structure is built so that no microphase separated structure can be obtained. Thus, it is preferable to anneal at a suitable temperature at which a suitable speed of microphase separation is obtained. Though dependent on the molecular weight and the type of the block copolymer, the temperature of annealing is preferably 130 to 280° C. The annealing is performed by using an oven or hot plate. If an oven is used, annealing is performed at a low temperature for a long time. If a hot plate is used, annealing is performed at a high temperature for a short time.

If annealing is performed under an atmosphere in which a trace quantity of a reactive gas such as oxygen is present, block copolymers may be decomposed if the temperature of annealing rises to a high temperature. Thus, it is preferable to perform annealing under an atmosphere of an inert gas such as argon or nitrogen from the viewpoint of preventing decomposition of block copolymers. Annealing may also be performed under an atmosphere of a forming gas containing about 3% of hydrogen if necessary.

The fine structure by microphase separation can be controlled based on a difference of free energy between the first block chain and the second block chain in block copolymers. In block copolymers including hydrophilic blocks and hydrophobic blocks, hydrophilic blocks have an affinity for hydrophilic materials and hydrophobic blocks have an affinity for hydrophobic materials. Thus, a microphase-separated structure of block copolymers can be controlled by forming a pattern including a hydrophilic region and a hydrophobic region on the surface of a polymer layer 12 through irradiation with energy rays.

If microphase separation of the block copolymer on a region where surface free energy of a polymer layer 12 is high, that is, a hydrophilic region, is caused, the block copolymer is oriented so that a hydrophilic block chain comes into contact with the polymer layer 12 and a hydrophobic block chain moves away from the polymer layer 12. On the other hand, in a region where surface free energy of a polymer layer 12 is low, that is, a hydrophobic region, a hydrophobic block chain comes into contact with the polymer layer 12 and a hydrophilic block chain moves away from the polymer layer 12. Therefore, if the surface of the polymer layer 12 is made hydrophilic or hydrophobic, the first block chain and the second block chain of block polymers are oriented parallel to the substrate 11 when microphase separation of the block polymer layer 14 formed thereon is caused. As a result, a lamellar phase in which the first block chain layer 14a and the second block chain layer 14b of block polymers are alternately stacked in a direction perpendicular to the substrate 11 is formed (hereinafter, also called a lamellar phase parallel to the substrate). Because fluctuations are present in microphase separation of block copolymers, block chain layers may not be exactly parallel to the substrate 11.

To obtain such a microphase-separated structure, it is preferable to set surface free energy of the polymer layer 12 close to surface free energy of the first block chain or surface free energy of the second block chain.

If, for example, block copolymers of polystyrene and polymethyl methacrylate are used, a polystyrene layer comes into contact with the polymer layer 12 and a lamellar phase in which the polystyrene layer and a polymethyl methacrylate layer are alternately stacked in a direction perpendicular to the substrate 11 is formed. In this case, the surface of the polymer layer 12 is brought to an energy state so that the contact angle of water on the surface of the polymer layer 12 is, for example, 90°. This is caused by surface free energy on the polymer layer 12 being set close to surface free energy of polystyrene. If the surface of the polymer layer 12 is brought to an energy state so that the contact angle of water on the surface of the polymer layer 12 is, for example, 75°, the polymethyl methacrylate layer comes into contact with the polymer layer 12 and a lamellar phase in which the polystyrene layer and a polymethyl methacrylate layer are alternately stacked in a direction parpendicular to the substrate 11 is formed. This is caused by surface free energy on the polymer layer 12 being set close to surface free energy of polymethyl methacrylate.

If block polymers of polystyrene and polymethyl methacrylate are used, block copolymers applied on a predetermined region of the surface of the polymer layer 12 can be oriented perpendicular to the substrate 11 by bringing the region of the surface of the polymer layer 12 to an energy state so that the contact angle of water on the region is 75 to 80° or 90° or more.

If the surface of the polymer layer 12 is brought to an intermediate energy state between hydrophilicity and hydrophobicity, both of the first and second block chains of block polymers come into contact with the polymer layer 12. In this condition, block polymers are oriented perpendicular to the substrate 11. As a result, a microphase-separated structure in which the first block chain layer 14a and the second block chain layer 14b are alternately stacked in a direction parallel to the substrate 11 is formed. Because fluctuations are present in microphase separation of block copolymers, block chain layers 14a, 14b may not be exactly perpendicular to the substrate 11.

To obtain such a microphase-separated structure, it is preferable to bring surface free energy of the polymer layer 12 to an intermediate energy state between surface free energy of the first block chain and surface free energy of the second block chain of block polymers. In a region of the surface of the polymer layer 12 having such an energy state, the energy relationship between the first block chain and the surface of the polymer layer 12 and the energy relationship between the second block chain and the surface of the polymer layer 12 become equal, making block chains more likely to be oriented perpendicular to the substrate 11.

If, for example, block polymers of polystyrene and polymethyl methacrylate are used, block copolymers applied on a predetermined region of the surface of a polymer layer 12 can be oriented parallel to the substrate 11 by bringing the region to an energy state so that the contact angle of water on the region is more than 80° and less than 90°.

The microphase-separated structure formed here is preferably a lamellar phase in which the first block chain layer 14a and the second block chain layer 14b are alternately stacked in a direction parallel to the substrate 11 (hereinafter, also called a lamellar phase perpendicular to the substrate) or a cylinder phase formed perpendicularly to the substrate 11.

If a lamellar phase is formed by microphase separation of block copolymers, the first and second block chain layers 14a, 14b in the lamellar phase perpendicular to the substrate 11 are preferably stacked in a direction perpendicularly to an interface between a lamellar phase parallel to the substrate 11 and a lamellar phase perpendicular to the substrate 11. Alternatively, the first and second block chain layers 14a, 14b in the lamellar phase perpendicular to the substrate 11 are preferably stacked in a direction parallel to the interface between a lamellar phase parallel to the substrate 11 and a lamellar phase perpendicular to the substrate 11.

By controlling free energy on the surface of the polymer layer 12 as described above, that is, creating regions of energy states of hydrophobicity and hydrophilicity and/or an intermediate state therebetween, a microphase-separated structure in which the first and second block chain layers 14a, 14b are alternately stacked in a direction perpendicularly to the substrate 11 and a microphase-separated structure in which the first and second block chain layers 14a, 14b are arranged in a direction parallel to the substrate 11 can simultaneously be formed.

If, after phase separation of block copolymers being caused as described above, one of the first and second block chains is removed and the other is left, a line and space pattern of block copolymers can be formed. If the left pattern is used as a mask to etch an underlayer, that is, the substrate 11 itself or a metal layer or insulating layer formed on the substrate 11, a fine line and space pattern can be formed on the underlayer.

In a microphase-separated structure in which the first block chain layer 14a and the second block chain layer 14b are alternately stacked in a direction parpendicular to the substrate 11, block chain layers having different etching resistance are alternately stacked parallel to the substrate 11. If one block chain is removed by etching, etching stops in the region when the block chain having stronger etching resistance appears on the surface. Thus, no fine pattern is formed on the polymer layer 12. In a microphase-separated structure in which the first block chain layer 14a and the second block chain layer 14b are alternately stacked in a direction parallel to the substrate 11, on the other hand, a pattern of a nano structure is formed on the polymer layer 12 if one block chain is removed by etching.

According to the method in the present embodiment, a microphase-separated structure of block copolymers on a region where a fine pattern should be formed and on a region where no pattern should be formed can be formed simultaneously. Therefore, a pattern can be formed with less process. According to a conventional method, it is necessary to mask a region of a substrate where no fine pattern should be formed with a resist in advance. According to the method in the present embodiment, however, a microphase-separated structure in which the first block chain layer 14a and the second block chain layer 14b are alternately stacked in a direction perpendicular to the substrate 11 can be formed on a region where no pattern should be formed. Thus, a block chain layer parallel to the substrate 11 is left in this region after a process in which one of the first and second block chains is removed. Therefore, there is no need to mask a region where no pattern should be formed with a resist. By leaving a block chain layer parallel to the substrate 11 in the region where no pattern should be formed, a higher etching contrast is exhibited when compared with a conventional method in which no phase separation of block copolymers is caused in the region. This is because if one of the first and second block chains is removed from the block copolymer layer 14 presented in a mixed state without causing microphase separation, the surface of the block copolymer layer 14 becomes uneven. Further, according to the method in the present embodiment, there is no need to modify block copolymers by a protecting group or the like and thus, a pattern can be formed easily at a low cost.

EXAMPLES

The embodiment will be described below based on examples. In the examples below, the contact angle of water on the surface of a polymer layer can be changed arbitrarily in the range of 85 to 60° by changing the exposure time of energy rays. A larger contact angle of a water droplet means lower free energy of the surface of a polymer layer, that is, a hydrophobic region. On the other hand, a smaller contact angle means higher free energy of the surface of a polymer layer, that is, a hydrophilic region.

Example 1

The surface of a silicon wafer was treated by a UV washer for five minutes. A 1 w/w % solution was prepared by dissolving silanol substituted crosslinking polysilane (manufactured by Osaka Gas chemicals, OGSOL SI-20) in propylene glycol monomethyl ether acetate and a silicon wafer was coated with the solution by spin-coating to form a polymer layer. Then, the polymer layer was exposed to a mercury lamp for 30 minutes to form a pattern of an exposed region and a non-exposed region. After that, the silicon wafer was heated by a baker at 250° C. for 30 minutes.

Next, the contact angle of a water droplet on the exposed region and the non-exposed region was measured to verify that the exposed region has been changed to hydrophilic. The contact angle of water on the exposed region was 76° and the contact angle of water in the non-exposed region was 83°. The contact angle of water was measured by the θ/2 method. The angle 30 seconds after dropping a water droplet whose diameter was about 1.4 mm onto the polymer layer was measured to avoid being influenced by gravity.

Separately, a solution of block copolymer was prepared. As the block copolymer, P189-SMMA, which was a block copolymer (PS-b-PMMA) of polystyrene (PS) and polymethyl methacrylate (PMMA) purchased from Polymer Source, was used.

Regarding P189-SMMA, the number average molecular weights (Mn) of the polystyrene block and the polymethyl methacrylate block were 46900 and 39600, respectively and the degree of dispersion (Mw/Mn) was 1.08.

The propylene glycol monomethyl ether acetate solution of block polymers was filtered by a membrane filter of 0.2 μm, the polysilane layer was coated therewith, and the silicon wafer was baked on a hot plate at 110° C. for 90 seconds to form a block copolymer layer.

Next, microphase separation of block copolymers was caused by annealing at 180° C. for 10 hours in an oven under an atmosphere of nitrogen. The formed microphase-separated structure in a region of 500 nm×500 nm of each sample was evaluated by using an atomic force microscope (AFM) (Nanoscope III). A super-sharp silicon chip (SSS-NCH-50)

was used as a cantilever and measurement was made in tapping mode to evaluate a pattern from the obtained phase image. As a result, a microphase-separated structure in which the polystyrene block layer and the polymethyl methacrylate block layer are alternately stacked in a direction perpendicular to the substrate (hereinafter, a lamellar phase parallel to the substrate) was formed on the exposed region of polysilane and a microphase-separated structure in which the polystyrene block layer and the polymethyl methacrylate block layer are alternately stacked in a direction parallel to the substrate (hereinafter, a lamellar phase perpendicular to the substrate) was formed on the non-exposed region of polysilane.

The polymethyl methacrylate block is selectively etched by putting the obtained sample into a reactive ion etching apparatus under conditions of the power of 50 W, oxygen gas pressure of 1.0 Pa, and flow rate of 50 sccm. As a result, polystyrene block is left to form a pattern.

Example 2

The surface of a silicon wafer was treated by a UV washer for five minutes. A 1% solution was prepared by dissolving silanol substituted crosslinking polysilane (manufactured by Osaka Gas chemicals, OGSOL SI-20) in propylene glycol monomethyl ether acetate and a silicon wafer was coated with the solution by spin-coating and heated at 110° C. for 90 seconds. Then, a reticle having mask portions of 10 and 100 µm square was arranged on a polysilane layer and exposed to a mercury lamp for 10 seconds to form a pattern of an exposed region and a non-exposed region. The contact angle of water on the exposed region of the polysilane layer was 80° and the contact angle of water on the non-exposed region of the polysilane layer was 83°. Then, the silicon wafer was heated by a baker at 250° C. for 30 minutes.

Separately, a solution of block copolymer was prepared. As the block copolymer, P189-SMMA, which was a block copolymer (PS-b-PMMA) of polystyrene (PS) and polymethyl methacrylate (PMMA) purchased from Polymer Source, was used.

Regarding P189-SMMA, the number average molecular weights (Mn) of the polystyrene block and the polymethyl methacrylate block were 46900 and 39600, respectively and the degree of dispersion (Mw/Mn) was 1.08.

The propylene glycol monomethyl ether acetate solution of block polymers was filtered by a membrane filter of 0.2 µm and applied to polysilane layer. Thereafter, the silicon wafer was baked on a hot plate at 110° C. for 90 seconds to form a block copolymer layer.

Next, microphase separation of block copolymers was caused by annealing at 180° C. for 10 hours in an oven under an atmosphere of nitrogen. The formed microphase-separated structure in a region of 500 nm×500 nm of each sample was evaluated by using an atomic force microscope (Nanoscope III). A super-sharp silicon chip (SSS-NCH-50) was used as a cantilever and measurement was made in tapping mode to evaluate a pattern from the obtained phase image. A lamellar phase perpendicular to the substrate was observed on the region where light was blocked with a mask and a lamellar phase parallel to the substrate was observed on the exposed region.

Example 3

The experiment was conducted in the same manner as in Example 2 except that the exposure time was 120 seconds. The contact angle of water on the exposed region of the polysilane layer was 79° and the contact angle of water on the non-exposed region of the polysilane layer was 83°. As a result, a lamellar phase perpendicular to the substrate was observed on the region where light was blocked with a mask and a lamellar phase parallel to the substrate was observed on the exposed region.

Example 4

The experiment was conducted in the same manner as in Example 3 except that the block polymer to be used was P2813-SMMA. Regarding P2813-SMMA, the number average molecular weights (Mn) of the polystyrene block and the polymethyl methacrylate block were 130000 and 133000 respectively and the degree of dispersion (Mw/Mn) was 1.1. The contact angle of water on the exposed region of the polysilane layer was 79° and the contact angle of water on the non-exposed region of the polysilane layer was 83°. If the experiment is conducted as described above, a lamellar phase perpendicular to the substrate is observed on the non-exposed region and a lamellar phase parallel to the substrate is observed on the exposed region.

Example 5

The experiment was conducted in the same manner as in Example 3 except that the block polymer to be used was P3964-SMMA.

Regarding P3964-SMMA, the number average molecular weights (Mn) of the polystyrene block and the polymethyl methacrylate block were 21000 and 21000 respectively and Mw/Mn was 1.07. The contact angle of water on the exposed region was 79° and the contact angle of water on the non-exposed region was 83°. As a result, a lamellar phase perpendicular to the substrate was observed on the region where light was blocked with a mask and a lamellar phase parallel to the substrate is observed in the exposed region.

Example 6

The experiment is conducted in the same manner as in Example 2 except that an ArF excimer laser stepper is used instead of an exposure by a mercury lamp and light is exposured in 500 mJ/cm$^2$ through a mask having a transmission portion and a non-transmission portion formed alternately in a line shape at intervals of 1 µm. The contact angle of water on the exposed region is 76° and the contact angle of water on the non-exposed region is 83°. If microphase separation of block copolymers was caused in the same as in Example 2, as shown in FIG. 2A as a plan view, it was verified that a lamellar phase perpendicular to the substrate was formed on the non-exposed region 22 in which light was blocked with a mask and a polystyrene block layer 22a and a polymethyl methacrylate block layer 22b were alternately stacked. On the other hand, a lamellar phase parallel to the substrate is formed on the exposed region 21.

In the lamellar phase perpendicular to the substrate, a stable structure changes depending on an energy state of the adjacent lamellar phase parallel to the substrate. Plan views showing how the stable structure changes are shown in FIGS. 2A to 2C. If free energy on a side surface of a lamellar phase parallel to the substrate on the exposed region 21 was intermediate energy between free energy of the polystyrene block layer 22a and free energy of the polymethyl methacrylate block layer 22b, the stable structure was the structure shown in FIG. 2A. If free energy on the side surface of a lamellar phase parallel to the substrate on the exposed region 21 was equivalent to free energy of the polystyrene block layer 22a, the stable structure was the structure shown in FIG. 2B. If free energy on the side surface of a lamellar phase parallel to the substrate on the exposed region 21 was equivalent to free energy of the polymethyl methacrylate block layer 22b, the stable structure was a structure in which the polystyrene block layer 22a and the polymethyl methacrylate block layer 22b are interchanged. If free energy on a side surface of a lamellar phase parallel to the substrate on the exposed region 21 does not affect the polystyrene block layer 22a and the polymethyl methacrylate block layer 22b, the orientation thereof was not controlled and a microphase separation structure as shown in FIG. 2C appears.

Example 7

The experiment was conducted in the same manner as in Example 2 except that an KrF excimer laser stepper was used instead of an exposure by a mercury lamp and light was exposed in 500 mJ/cm$^2$ through a mask having a transmission portion and a non-transmission portion formed alternately in a line shape at intervals of 1 µm. The contact angle of water on the exposed region was 76° and the contact angle of water on the non-exposed region was 83°. As a result, a microphase-separated structure as shown in FIG. 2A is appeared.

According to the embodiment or the examples, it is possible to provide a method of forming a pattern capable of forming a pattern with less processes at a low cost by using microphase separation of block copolymers. A method of forming a pattern in which the etching contrast is improved can also be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, comprising:
    forming a polymer layer on a substrate, the polymer layer including first and second regions, wherein the first region is to be patterned in a later step and the second region is not to be patterned in a later step;
    selectively irradiating either of the first and second regions with energy rays or irradiating the first and second regions with energy rays under different conditions to cause a difference in surface free energy between the first and second regions;
    forming a block copolymer layer on the polymer layer, the block copolymer layer including a block copolymer containing first and second block chains different from each other; and
    causing microphase separation in the block copolymer layer to simultaneously form first and second microphase-separated structures on the first and second regions, respectively,
    the first microphase-separated structure on the first region comprising a lamellar phase in which a first block chain layer and a second block chain layer are formed perpendicularly to the substrate and alternately arranged, and the second microphase-separated structure on the second region comprising a lamellar phase in which a first block chain layer and a second block chain layer are formed parallel to the substrate and alternately stacked.

2. The method according to Claim 1, wherein the first block chain comprises polystyrene, the second block chain comprises polymethyl methacrylate, and the energy ray-irradiation is performed such that a contact angle of water on the first region is more than 80° and less than 90° and a contact angle of water on the second region is 75 to 80° or 90° or more.

3. The method according to claim 1, further comprising:
    selectively removing either of the first and second block chain layers in the lamellar phase from at least the first phase-separated structure on the first region to form a mask patternformed perpendicularly to the substract; and
    etching the surface of the substrate using the mask pattern as an etching mask.

4. The method according to claim 1, wherein the polymer layer comprises a silicon-based material.

5. The method according to claim 4, wherein the silicon-based material is polysilane.

6. The method according to claim 1, wherein, when viewed on a surface of the first microphase-separated structure on the first region, the first and second block chain layers in the lamellar phase are arranged in a direction perpendicularly to an interface between the second microphase-separated structure on the second region and the first microphase-separated structure on the first region.

* * * * *